United States Patent [19]

Baudart

[11] Patent Number: 5,461,309
[45] Date of Patent: Oct. 24, 1995

[54] DEVICE FOR MEASURING TEMPERATURE USING A ROGOWSKI COIL

[75] Inventor: Christophe Baudart, Lyons, France

[73] Assignee: GEC Alsthom T&D SA, Paris, France

[21] Appl. No.: 329,849

[22] Filed: Oct. 27, 1994

Related U.S. Application Data

[62] Division of Ser. No. 114,246, Sep. 1, 1993, Pat. No. 5,442,280.

[30] Foreign Application Priority Data

Sep. 10, 1992 [FR] France .................. 92 10801

[51] Int. Cl.$^6$ .................................................. G01R 19/00
[52] U.S. Cl. ........................................ 324/127; 324/105
[58] Field of Search ........................ 324/127, 126, 324/117 R, 105; 336/92, 84; 374/114, 100, 132, 172

[56] References Cited

U.S. PATENT DOCUMENTS

| 4,384,289 | 5/1983 | Stillwell et al. ............... 324/126 |
| 4,635,055 | 1/1987 | Fernandes et al. ............... 324/127 |
| 4,709,205 | 11/1987 | Baurand et al. ............... 327/127 |
| 5,055,816 | 10/1991 | Altman et al. ............... 336/200 |

FOREIGN PATENT DOCUMENTS

| 721389 | 4/1942 | Germany . |
| 665303A5 | 4/1988 | Switzerland . |

OTHER PUBLICATIONS

*Patent Abstracts of Japan*, vol. 9, No. 239 (P-391(1962)25 Sep. 1985, JP-A-60 93 325 (Mitisubishi) 25 May 1985.

*Primary Examiner*—Vinh P. Nguyen
*Attorney, Agent, or Firm*—Sughrue, Mion, Zinn, Macpeak & Seas

[57] ABSTRACT

A Rogowski coil is used as a precise current and temperature measuring device (in particular a device that is highly insensitive to temperature variations). The Rogowski coil is of the type including at least one printed circuit plate provided with a circular cutout. The coil is implemented by metal deposits on each of the two faces of the plate and extending along radii such that geometrical projections thereof pass through the center of the cutout. Electrical connections between the radii on one face and those on the opposite face are implemented by plated-through holes that pass through the thickness of the plate.

1 Claim, 3 Drawing Sheets

DEVICE FOR MEASURING TEMPERATURE USING A ROGOWSKI COIL

This is a divisional of application Ser. No. 08/114,246, filed Sep. 1, 1993, now U.S. Pat. No. 5,442,280.

BACKGROUND OF THE INVENTION

1. Field of the Invention

The present invention concerns the use of a Rogowski coil as described in U.S. patent application Ser. No. 08/067628 filed 28 May 1993 now U.S. Pat. No. 5,414,400.

2. Description of the Prior Art

A coil of this kind comprises at least one printed circuit plate provided with a circular cutout, the coil being implemented by rectilinear metal deposits on each of the two faces of the plate and extending along radii such that geometrical projections thereof intersect at the center of said cutout, electrical connections between the radii on one face and those on the opposite face being implemented by plated-through holes that pass through the thickness of the plate.

A coil of this kind has perfect axial symmetry. The winding constituted by the radii and the holes comprises an outward leg and a return leg around the circular cutout with an input and an output on the same side on the plate separated by a distance of a few tenths of a millimeter. A coil of this kind is also relatively insensitive to temperature variations because the material supporting the winding is epoxy resin.

A first object of the invention is a simple way of using a coil of this kind to produce a current measuring device that is substantially insensitive to temperature variations.

Another object of the invention is to provide a temperature measuring device using a Rogowski coil of this kind.

Current is usually measured by means of a Rogowski coil by loading the coil with a high value resistor, measuring the voltage across this resistor and integrating this voltage. The invention utilizes this method, employing a particular value of the load resistor which renders the measurement substantially independent of temperature.

The temperature is measured by using the Rogowski coil winding as one arm of a Wheatstone bridge.

SUMMARY OF THE INVENTION

In one aspect, the invention consists in a device for measuring an electrical current in a conductor using a Rogowski coil through which said conductor passes, said Rogowski coil being of the type comprising at least one printed circuit plate provided with a circular cutout, the coil being implemented by metal deposits on each of the two faces of the plate and extending along radii such that geometrical projections thereof pass through the center of said cutout, electrical connections between the radii on one face and those on the opposite face being implemented by plated-through holes that pass through the thickness of the plate, the winding comprising an outward leg and a return leg around the cutout with an input and an output on the same face of the plate, separated by a distance of a few tenths of a millimeter, said device comprising a device for measuring the voltage U across a resistor R in series with said Rogowski coil, said resistor R having a value equal to $$R_0 = r_0(\alpha_r - \alpha_s - \alpha_R)/\alpha_s$$

where:

$R_0$ is the ohmic resistance of the resistor R at a reference temperature, $r_0$ is the ohmic resistance of the Rogowski coil at said reference temperature, $\alpha_R$ is the temperature coefficient of the conductive material of said Rogowski coil, $\alpha_s$ is the temperature coefficient of the sensitivity of the Rogowski coil, $\alpha_R$ is the temperature coefficient of the resistor R, the current I to be measured being related to the voltage U by the equation:

$$U = js_0 \omega I R_0/(R_0 + r_0)$$

where:

$s_0$ is the sensitivity of said Rogowski coil at said reference temperature, j is the complex operator such that $j^2 = -1$, and $\omega$ is the angular frequency of the current to be measured.

In another aspect, the invention consists in a device for measuring temperature using a Rogowski coil of the type comprising at least one printed circuit plate provided with a circular cutout, the coil being implemented by metal deposits on each of the two faces of the plate and extending along radii such that geometrical projections thereof pass through the center of said cutout, electrical connections between the radii on one face and those on the opposite face being implemented by plated-through holes that pass through the thickness of the plate, the winding comprising an outward leg and a return leg around the cutout with an input and an output on the same face of the plate, separated by a distance of a few tenths of a millimeter, in which device said Rogowski coil of ohmic resistance r constitutes one of the branches of a Wheatstone bridge comprising three other resistors r2, r3 and r4, one diagonal of said bridge being connected to a voltage U, the voltage e measured across the other diagonal being related to the temperature θ by the equation:

$$e = U\, A/B$$

where:

$A = ((r \cdot r_{40}(1+\alpha\theta) - r_{20} \cdot r_{30}(1+2\alpha\theta))$, $B = ((r + r_{20}(1+\alpha\theta)) \cdot ((r_{30}(1+\alpha\theta) \cdot r_{40}(1+\alpha\theta))$, and $r_{20}, r_{30}$ and $r_{40}$ are the respective ohmic resistance values of said resistors r2, r3 and r4, α denoting the common temperature coefficient of said resistors.

The invention is now described in detail with reference to the appended drawings.

DETAILED DESCRIPTION OF THE INVENTION

Figure 1:
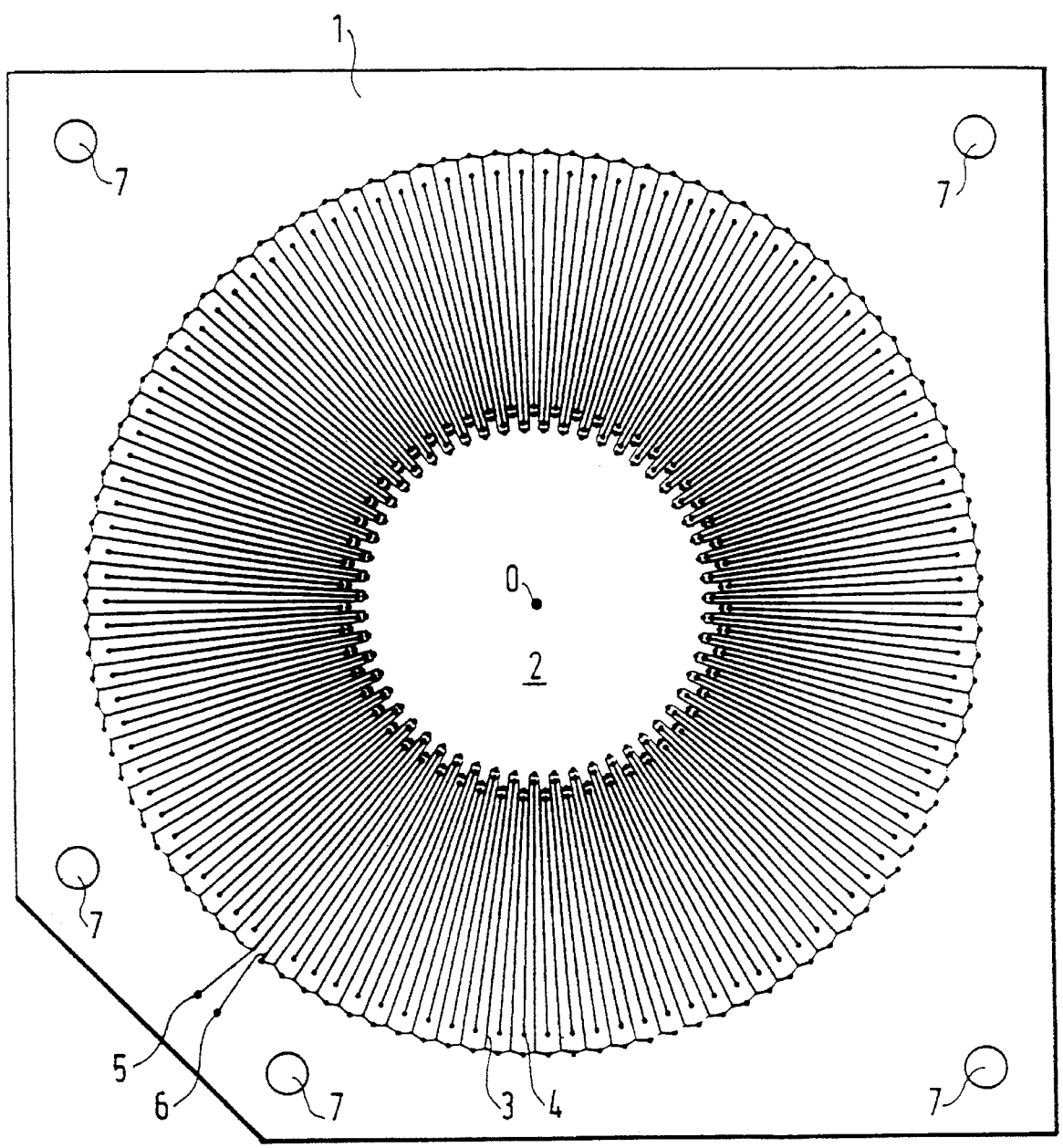
FIG. 1 is a plan view of a Rogowski coil of the type used in the present invention.

FIG. 1 is a plan view of a Rogowski coil of the type used to implement the measuring devices in accordance with the invention.

It comprises a double-sided printed circuit plate, preferably of epoxy resin, advantageously reinforced with laminated glassfiber, and having a low coefficient of thermal expansion. As an alternative the plate may be made from ceramic or any like material having a very low coefficient of thermal expansion.

The plate is advantageously 1.6 mm thick.

The preferably square plate has a central hole 2 to receive the cable in which the current is to be measured.

The winding is constituted by deposits 3, etc of copper on each side of the plate; these deposits are rectilinear and radial, i.e. a line through them passes through the center O of the plate; as described later, the deposits on one face are connected to the deposits on the opposite face by plated-through holes 4 which pass through the plate.

The surface of the deposit is chemically stabilized by a deposit of gold of controlled thickness. This controls the internal resistance of the Rogowski coil.

The man skilled in the art knows how to substitute other appropriate deposits for the aforementioned gold and how to protect such deposits by appropriate means, for example by means of a protective varnish.

FIG. 1 shows the input 5 and the output 6 of the coil which are a few tenths of a millimeter apart to conform to the axial symmetry of the winding.

Holes 7 are used to fix the plate to other plates to construct a multiplate Rogowski coil.

Figure 2:
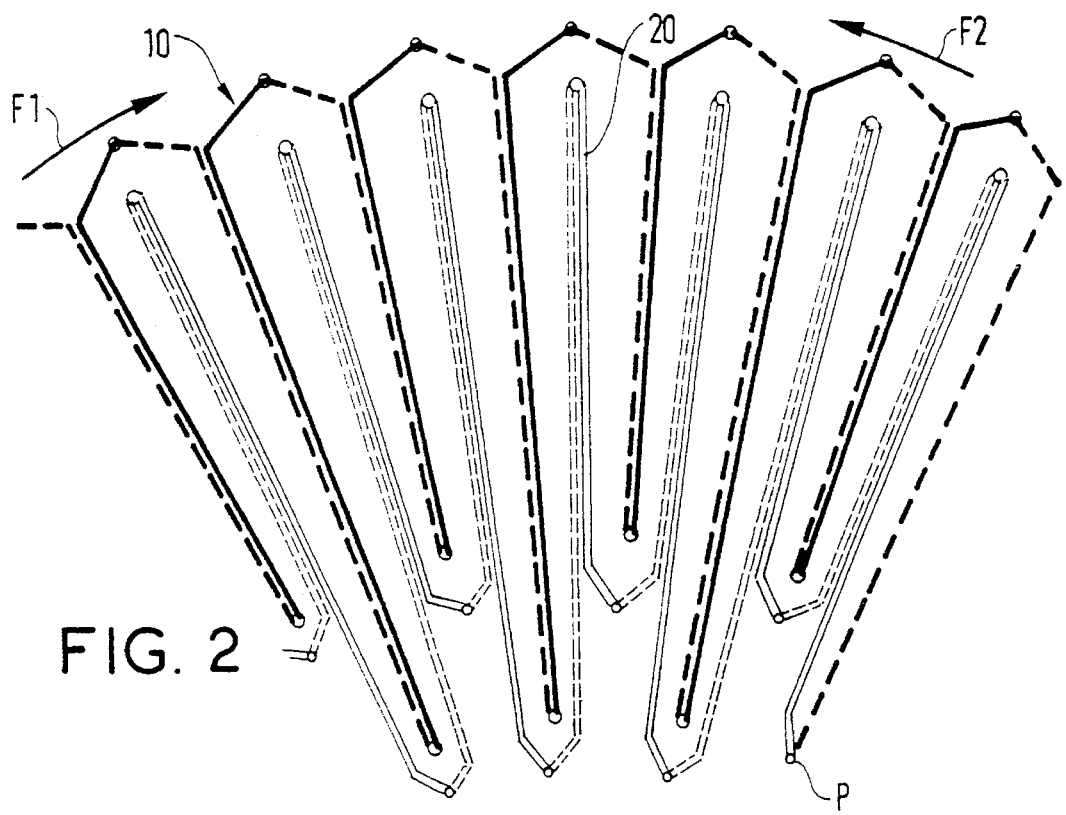
FIG. 2 is a diagram showing how the aforementioned type Rogowski coil is wound.

FIG. 2 is a diagram showing how the winding is constituted. To produce perfect axial symmetry the winding is constituted by two windings in series, a first winding 10 wound clockwise and a second winding 20 wound anticlockwise. The figure is a diagrammatic plan view of part of the winding and uses the following conventions: the first winding 10 is shown in continuous thick line when the deposit is on the visible face of the plate and in dashed thick line when the deposit is on the opposite face; the second winding 20 is shown by a double line which is either continuous or dashed depending on whether the deposit is on the visible face or on the opposite face. To facilitate understanding of the diagram the two radii of the same turn are shown side-by-side but it must be understood that in reality the two radii are exactly aligned with each other on opposite faces of the plate. The arrow F1 shows the winding direction of the first winding. The arrow F2 shows the winding direction of the other winding. The windings 10 and 20 are connected in series at a point P.

Figure 3:
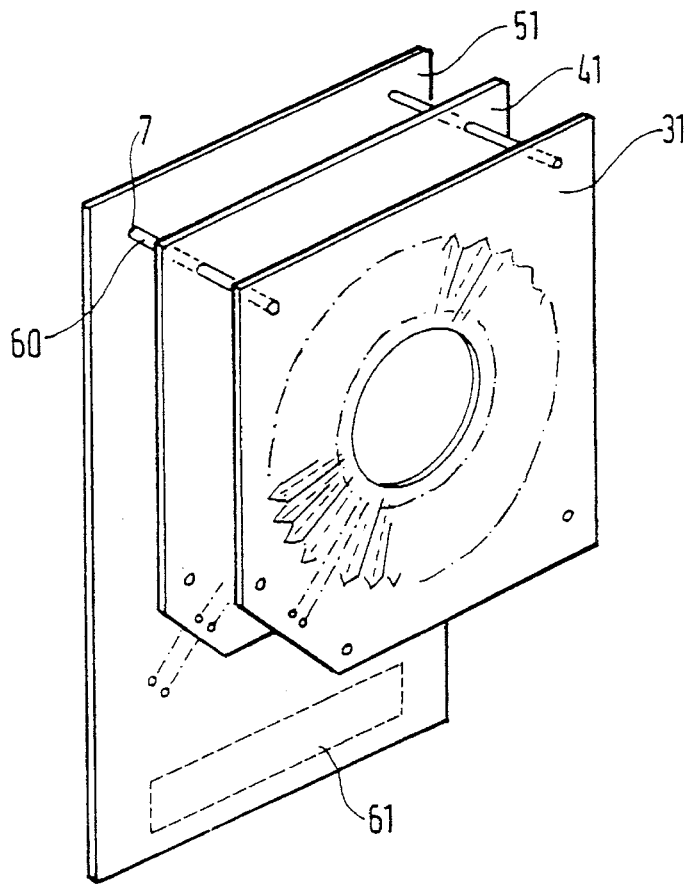
FIG. 3 is a perspective view of a Rogowski coil with two active plates and one terminal plate.

FIG. 1 is drawn on a 1/1 scale. A plate this size may comprise in the order of 250 turns; it is possible to increase the sensitivity of the coil by using several cards of the type shown in FIG. 1. FIG. 3 shows a coil comprising three parallel cards 31, 41 and 51 fastened together by rods 60 passing through the holes 7; the cards 31 and 41 have triangular cutouts at one corner and of unequal size to facilitate connecting the coils by means of conductors (not shown) which pass through the plates perpendicularly to their plane.

In the FIG. 3 example the plate 51 does not have any cutout, is rectangular, and carries the electronic circuit for processing signals induced in the Rogowski coil, shown symbolically by the rectangle 61. The connections are therefore very short and do not induce any interference signals.

Note that the output connections are implemented as tracks (metal deposits) on the same side of the plate in order to minimize the influence of the magnetic field produced by the current to be measured.

If the Rogowski coil of the aforementioned type is loaded with a very high impedance (open circuit operation) the voltage across it is of the form:

$$e = s\omega I = s 2\pi f I$$

in which I is the current to be measured, $\omega$ is its angular frequency, f is its frequency and s is a coefficient of proportionality dependent on the coil and called the sensitivity of the coil.

The variation of the sensitivity s with temperature may be represented by the equation:

$$s = s_0(1 + \alpha_s \Delta\theta)$$

in which $s_0$ is the sensitivity of the coil at a reference temperature, $\alpha_s$ is the temperature coefficient, and $\Delta\theta$ is the temperature difference compared to the reference temperature.

For a coil of the aforementioned type the value of $\alpha_s$ is around $60 \cdot 10^{-6}/°C$.

Figure 4:
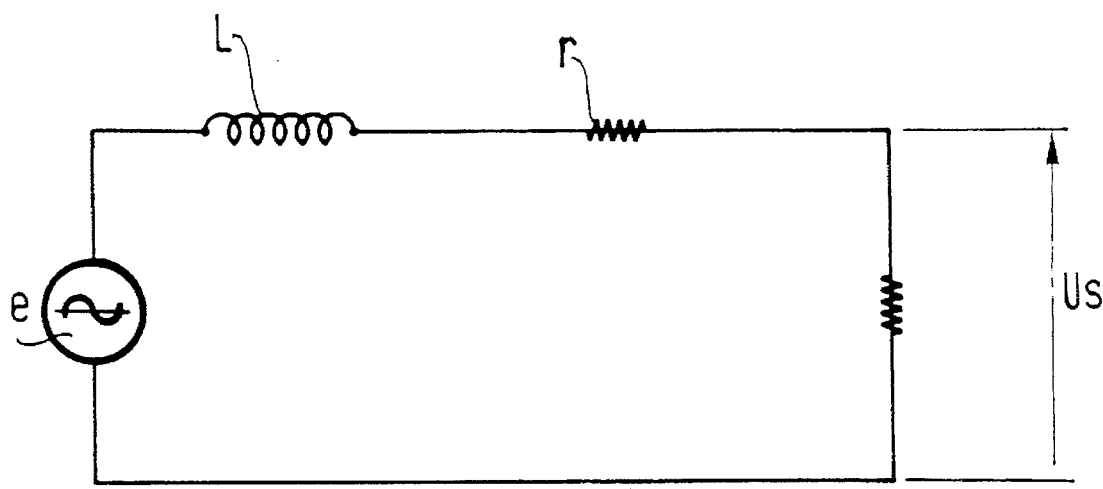
FIG. 4 is a schematic of the Rogowski coil used as a voltage measuring device.

FIG. 4 is a schematic of the current measuring device of the invention. It comprises a Rogowski coil of the aforementioned type equivalent to an alternating current supply e in series with a resistor r (the resistor of the coil) and an inductor L (the self-inductance of the coil equal to Ns where N is the number of turns in the coil), loaded by a resistor R, and a voltage measuring device $U_s$ shunting the resistor.

The voltage $U_s$ is related to the current by the equation:

$$U_s = js\omega I R / (R + r + jL\omega)$$

If $\alpha_R$ is the temperature coefficient of the resistor R such that $R = R_0(1 + \alpha_R \Delta\theta)$ and $\alpha_r$ is the temperature coefficient of the resistor E (the resistance of the coil) such that $r = r_0(1 + \alpha_r \Delta\theta)$:

$$U_s = js_0\omega I C / D$$

where:

$C = (1 + \alpha_s \Delta\theta) R_0 (1 + \alpha_R \Delta\theta)$
$D = R_0(1 + \alpha_R \Delta\theta) + r_0(1 + \alpha_r \Delta\theta) + jNs_0\omega(1 + \alpha_s \Delta\theta)$ Neglecting $\alpha_R$ (around $5 \cdot 10^{-6}/°C$.) in comparison with $\alpha_s$ (around $60 \cdot 10^{-6}/°C$. as already mentioned), taking:

$$R_0 = r_0(\alpha_r - \alpha_s - \alpha_R)/\alpha_s$$

and neglecting second order terms $\alpha_r \alpha_s (\Delta\theta)^2$:

$$U_s = (js_0 \omega I R_0 / (R_0 + r_0)) \cdot 1/F$$

where:

$F = (1 + jNs_0\omega/(R_0 + r_0)) \cdot ((1 + \alpha_0 \Delta\theta)/(1 + (\alpha_s + \alpha_R)\Delta\theta))$ Adopting the following approximations:

$\alpha_R \alpha_s \Delta\theta^2$ very much less than $(\alpha_R + \alpha_s)\Delta\theta$, and $(\alpha_s + \alpha_R \Delta\theta)$ very much less than 1:

$$U_s = js_0\omega(R_0/(r_0 + R_0)/(1 + jNs_0\omega(1 - \alpha_R \Delta\theta)/(R_0 + r_0))$$

In conclusion, the measured amplitude of the voltage is independent of temperature; choosing $\alpha_R < 5$ ppm/°C. (NiCr resistance), the phase defined by the equation:

$$\phi_s = \arctan(Ns_0\omega(1 - \alpha_R \Delta\theta)/(R_0 + r_0))$$

varies little with temperature.

Figure 5:
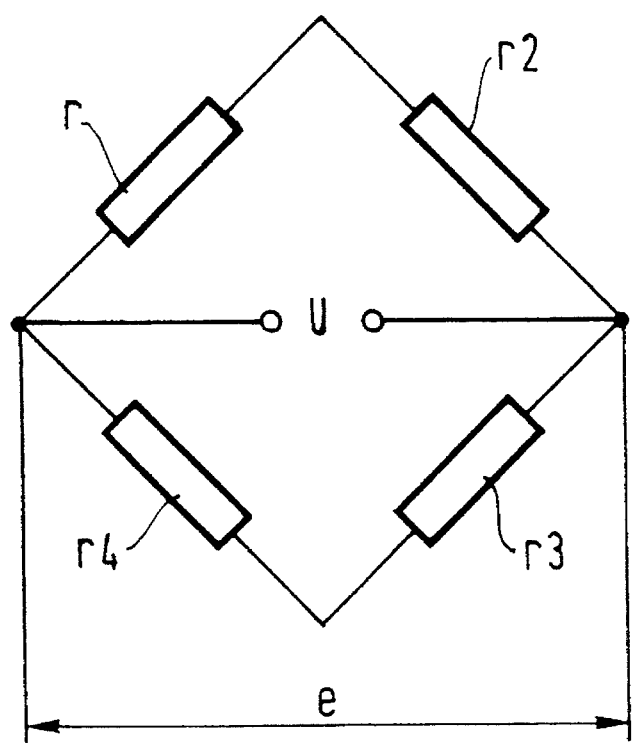
FIG. 5 is a schematic of the Rogowski coil used as a temperature measuring device.

FIG. 5 shows a temperature measuring device comprising a Wheatstone bridge one branch r of which is constituted by a Rogowski coil of the type described previously and the other branches r2, r3 and r4 of which are made from the same metal as the coil.

One diagonal of the bridge is connected to a voltage U, a DC voltage, for example. The other diagonal is connected to a voltage measuring device which measures a voltage e related to the temperature θ by the equation:

$$e = UA/B$$

where:

$A = ((r.r_{40}(1+\alpha\theta) - r_{20}.r_{30}(1+2\alpha\theta))$, $B = ((r+r_{20}(1+\alpha\theta)).((r_{30}(1\alpha\theta).r_{40}(1+\alpha\theta))$, and $r_{20}$, $r_{30}$ and $r_{40}$ are the respective resistances of the resistors r2, r3 and r4, α denoting their common temperature coefficient.

There is claimed:

1. Device for measuring temperature using a Rogowski coil of the type having a winding and comprising at least one printed circuit plate provided with a circular cutout, the coil being implemented by metal deposits on each of the two faces of the plate and extending along radii such that geometrical projections thereof pass through the center of said cutout, electrical connections between the radii on one face and those on the opposite face being implemented by plated-through holes that pass through the thickness of the plate, the winding comprising an outward leg and a return leg around the cutout with an input and an output on the same face of the plate, separated by a distance of a few tenths of a millimeter, in which said Rogowski coil has an ohmic resistance r and constitutes one of the branches of a Wheatstone bridge comprising three other resistors r2, r3 and r4, one diagonal of said bridge being connected to a voltage U, the voltage e measured across the other diagonal being related to the temperature θ by the equation:

$$e = U A/B$$

where:

$A = ((r.r_{40}(1+\alpha\theta) - r_{20}.r_{30}(1+2\alpha\theta))$, and $B = ((r+r_{20}(1+\alpha\theta)).((r_{30}(1+\alpha\theta).r_{40}(1+\alpha\theta))$, and $r_{20}$, $r_{30}$ and $r_{40}$ are the respective ohmic resistance values of said resistors r2, r3 and r4, α denoting the common temperature coefficient of said resistors.

* * * * *